United States Patent [19]

Wu

[11] Patent Number: 4,770,897
[45] Date of Patent: Sep. 13, 1988

[54] MULTILAYER INTERCONNECTION SYSTEM FOR MULTICHIP HIGH PERFORMANCE SEMICONDUCTOR PACKAGING

[75] Inventor: Andrew L. Wu, Shrewsbury, Mass.

[73] Assignee: Digital Equipment Corporation, Mass.

[21] Appl. No.: 46,160

[22] Filed: May 5, 1987

[51] Int. Cl.⁴ .............................................. B05D 5/12
[52] U.S. Cl. ................................. 437/228; 427/54.1; 427/98; 204/192.1; 430/310; 430/313; 430/314; 430/329; 430/315
[58] Field of Search ................... 427/98, 82, 54.1, 93; 29/569 R; 528/310; 430/313, 314, 329, 317, 315; 204/192 R

[56] References Cited

U.S. PATENT DOCUMENTS

| | | | |
|---|---|---|---|
| 3,427,197 | 2/1969 | Lilker | 429/98 |
| 3,928,670 | 12/1975 | Brummett | 427/98 |
| 3,969,751 | 7/1976 | Drukaroff | 357/54 |
| 4,310,568 | 1/1982 | Howard | 427/91 |
| 4,568,632 | 2/1986 | Blum | 427/54.1 |

OTHER PUBLICATIONS

Advance Notice of New Product, Ciba-Geigy, Microelectronic Chemicals, Aug. 13, 1985.
New Developements in Photosensitive Polyimides, E. Merck, no date.
Selectilux ® HTR 3 Photosensitive Polyiimide Preliminary Data Sheet, EM Industries, no date.

*Primary Examiner*—Vi Duong Dang
*Attorney, Agent, or Firm*—Finnegan, Henderson, Farabow, Garrett & Dunner

[57] ABSTRACT

A method for fabricating a multilayer interconnection system that is fully planar with completely sealed and corrosion resistant conductors separated by dielectric material.

14 Claims, 5 Drawing Sheets

MULTILAYER INTERCONNECTION SYSTEM FOR MULTICHIP HIGH PERFORMANCE SEMICONDUCTOR PACKAGING

FIELD OF THE INVENTION

This invention relates to the fabrication of a planar multilayer interconnection system for multichip high performance semiconductor packaging.

BACKGROUND OF THE INVENTION

Very Large Scale Integration (VLSI) and Ultra Large Scale Integration (ULSI) devices in semiconductor technology are expected to result in significant performance improvements in systems based on such devices. However, many of the advantages of such devices will be lost without significant improvements in device packaging techniques. A number of new designs, materials and processes capable of providing high density multilayer interconnections with controlled electrical characteristics have been proposed. These include high density printed circuit boards, cofired multilayer ceramics, customized multilayer copper/polyimide interconnections built on cofired ceramic substrates and wafer scale integration using semiconductor integrated circuit (IC) processing. One of the most versatile and cost effective of the interconnection technologies is a sequentially built multilayer structure of metal conductor and dielectric material using a substrate such as silicon, ceramic or molybdenum.

However, one of the problems encountered in the multilayer structure is the ability to obtain continuity of the upper layer metal films and the integrity of the dielectric insulating layer over the step formed by the underlying metallization pattern. The problem is caused by the protrusion of the metallization pattern that results in an increase in the degree of unevenness as the number of metallization layers increases.

Another problem relates to the adhesion between the metal conductor and the dielectric. For instance, the adhesion between a copper conductor and polyimide dielectric is enhanced by the use of a thin layer of chromium, titanium, titanium tungsten alloy or nickel between them. This thin layer of metal also serves as a corrosion barrier for the copper conductor. The two techniques previously known in the art, the subtractive and the additive process, were unable to provide a suitable layer between the conductor and the dielectric. The subtractive process did not provide a completely sealed and corrosion resistant copper conductor; and although the additive process formed a completely sealed and corrosion resistant copper conductor, extra processing steps were required, which resulted in extra expense.

SUMMARY OF THE INVENTION

The present invention provides many advantages over the prior methods. First, the present invention provides a fully planar, multilayer structure with completely sealed and corrosion resistant conductors separated by polyimide dielectric layers. The present invention also provides this structure without the use of the additional processing steps used in the prior art. This structure is a high density packaging that is useful with VLSI and ULSI devices.

Additional advantages provided by this invention are set forth, in part, in the following description. Other advantages will be obvious from the following description, or may become apparent by practice of the invention. The appended claims particularly point out how the advantages of the invention can be attained.

To obtain the advantages of the present invention, then, a layer of a planar multilayer interconnection system is fabricated using a method comprising:

(a) forming a dielectric sub-layer overlaying a base layer, the dielectric sub-layer being nonsoluble after the layer is cured;

(b) forming a sacrificial sub-layer overlaying the dielectric sub-layer, the sacrificial sub-layer being soluble after the layer is cured;

(c) removing a portion of the sacrificial sub-layer to expose a portion of the dielectric sub-layer;

(d) removing the exposed portion of the dielectric sub-layer and a selected portion surrounding the exposed portion of the dielectric sub-layer to expose a portion of the base layer, removal of the selected portion leaving an exposed portion of the sacrificial sub-layer overhanging the exposed portion of the base layer;

(e) depositing a first conductive adhesive sub-layer overlaying the dielectric and sacrificial sub-layers and the exposed area of the base layer without overlaying the exposed overhang portion facing the base layer of the sacrificial sublayer;

(f) depositing a conductive seeding sub-layer overlaying the first conductive adhesive sub-layer;

(g) removing the sacrificial sub-layer and the first conductive adhesive sub-layer and the conductive seeding sub-layer in contact with the sacrificial sub-layer;

(h) forming a conductor sub-layer by electrolessly plating a conductor sub-layer onto the seeding sub-layer; and (i) forming a second conductive adhesive sub-layer by electrolessly plating the second adhesive sub-layer onto the conductor sub-layer to form a surface which is planar with the dielectric sub-layer.

One preferred embodiment of the invention comprises a method for fabricating a layer of a planar multilayer interconnection system comprising:

(a) forming a polyimide sub-layer overlaying a base layer, the polyimide sub-layer being nonsoluble after the layer is cured;

(b) forming a metallic sub-layer overlaying the polyimide sub-layer;

(c) forming a sacrificial sub-layer overlaying the metallic sub-layer, the sacrificial sub-layer being selected from polyimides which are soluble after the layer is cured;

(d) removing a portion of the sacrificial sub-layer to expose a portion of the metallic sub-layer;

(e) removing the exposed portion of said metallic sub-layer to expose a portion of the polyimide sub-layer;

(f) removing the exposed portion of the polyimide sub-layer and a selected portion surrounding the exposed portion of the polyimide sub-layer to expose a portion of the base layer, removal of the selected portion leaving an exposed portion of the metallic sub-layer and the sacrificial sub-layer overhanging the exposed portion of the base layer;

(g) removing the portion of said metallic sub-layer overhanging the exposed portion of the base layer;

(h) depositing a first conductive adhesive sub-layer overlaying the polyimide and sacrificial sub-layers and the exposed area of the base layer without overlaying the exposed overhang portion facing the base layer of the sacrificial sub-layer;

(i) depositing a conductive seeding sub-layer overlaying the first conductive adhesive sub-layer;

(j) removing the sacrificial sub-layer and the first conductive adhesive sub-layer and the conductive seeding sub-layer in contact with the sacrificial sub-layer;

(k) removing the metallic sub-layer;

(l) forming a conductor sub-layer by electrolessly plating a conductor sub-layer onto the conductive seeding sub-layer; and (m) forming a second conductive adhesive sub-layer by electrolessly plating the second conductive adhesive sub-layer onto the conductor sub-layer to form a surface which is planar with the polyimide sub-layer.

In another preferred embodiment, the present invention comprises a method for fabricating a layer of a planar multilayer interconnection system comprising:

(a) forming a silicon dioxide sub-layer overlaying a base layer;

(b) forming a sacrificial sub-layer overlaying the silicon dioxide sub-layer, the sacrificial sub-layer being soluble after the layer is cured;

(c) removing a portion of the sacrificial sub-layer to expose a portion of the silicon dioxide sub-layer;

(d) removing the exposed portion of the silicon dioxide sub-layer and a selected portion surrounding the exposed portion of the silicon dioxide sub-layer to expose a portion of the base layer, removal of the selected portion leaving an exposed portion of the sacrificial sub-layer overhanging the exposed portion of the base layer;

(e) depositing a first conductive adhesive sub-layer overlaying the silicon dioxide and sacrificial sub-layers and the exposed area of the base layer without overlaying the exposed overhang portion facing the base layer of the sacrificial sub-layer;

(f) depositing a conductive seeding sub-layer overlaying the first conductive adhesive sub-layer;

(g) removing the sacrificial sub-layer and the first conductive adhesive sub-layer and the conductive seeding sub-layer in contact with the sacrificial sub-layer;

(h) forming a conductor sub-layer by electrolessly plating a conductor sub-layer onto the seeding sub-layer; and (i) forming a second conductive adhesive sub-layer by electrolessly plating the second adhesive sub-layer onto the conductor sub-layer to form a surface which is planar with the silicon dioxide sub-layer.

The accompanying drawings, which constitute a part of this specification, illustrate one embodiment of the invention and serve to explain the principles of the invention.

DETAILED DESCRIPTION OF THE INVENTION

Figure 1:
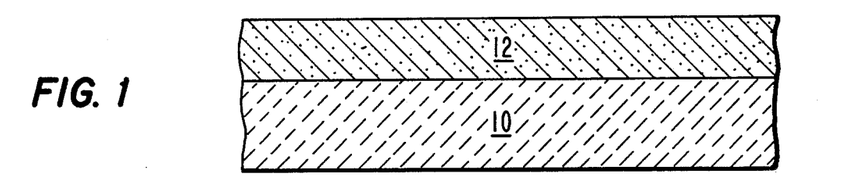
FIG. 1–12 are cross-sectional views of one embodiment of one layer of the multilayer interconnection system in various stages of completion.

Referring to FIG. 1, a base layer 10, which can either be a previously formed layer or a substrate such as silicon, ceramic, or molybdenum, is thoroughly cleaned to remove all contaminants and then subjected to a dehydration bake to remove the moisture from the surface of the base layer. Base layer 10 is then coated with an adhesion promoter for optimum adhesion before the coating of the dielectric sub-layer 12.

After this preparation step, the first step in forming a layer of the multilayer interconnection system, as shown in FIG. 1, comprises forming a dielectric sub-layer 12 overlaying the base layer 10. Any dielectric material can be used for this sub-layer as long as the sub-layer is nonsoluble after the layer is cured. The preferred dielectric sub-layer material is a photosensitive type polyimide which is nonsoluble after curing of the layer or a silicon dioxide, which is nonsoluble. Typical photosensitive polyimides that can be used include PROBIMIDE 300 series manufactured by CIBA-GEIGY Corporation in California or Selectilux HTR 3 manufactured by EM Industries, Inc. in New York. The dielectric sub-layer 12 can be applied using any conventional method, such as a spin or spray coating process.

If the dielectric material 12 used for the first dielectric sub-layer is a polyimide, then the polyimide must be softbaked. This is a mild heat treatment used to set the polyimide and remove excess solvent.

Figure 2:
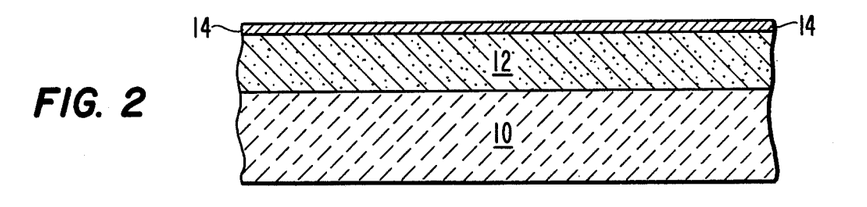

After softbake, if the dielectric material 12 is a photosensitive material and if the sacrificial sub-layer will be patterned using ultraviolet light, then the next step in forming the layer is forming a metallic sub-layer 14 overlaying the dielectric sub-layer 12, as shown in FIG. 2, to shield the dielectric sub-layer 12. Although any metal which will shield ultraviolet light can be used, the preferred metal is titanium. The metal is deposited as a film 14 with thickness suitable for shielding ultraviolet light. Generally a thickness of about 5000 to 10,000 angstroms is sufficient. This metallic sub-layer is formed at a substrate temperature equal to or less than the softbake temperature of the polyimide sub-layer to prevent premature curing of the polyimide sub-layer.

If the dielectric is not photosensitive, such as silicon dioxide, then no metallic sub-layer is necessary and the next sub-layer is applied directly over the dielectric sub-layer.

Figure 3:
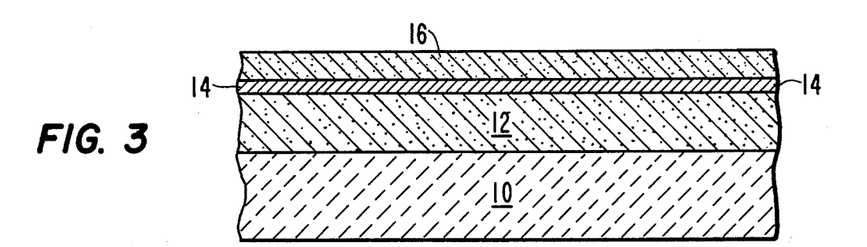
Figure 15:
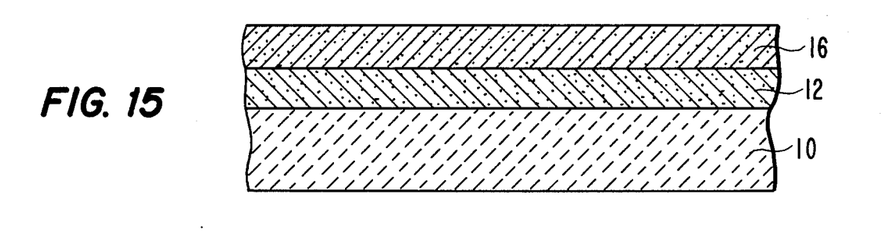
FIG. 15–19 are cross-sectional views of another embodiment of one layer of the multilayer interconnection system in various stages of completion.

Thereafter, as shown in FIG. 3 and 15, a sacrificial sub-layer 16 is formed which is overlaying the dielectric sub-layer 12, and, if present, the metallic sub-layer 14. Any conventional material used in the semiconductor art as a sacrificial layer can be used within the scope of the claimed invention. This sacrificial sub-layer, however, must be soluble after the layer is cured. Preferred materials for this sub-layer 16 include photosensitive material such as photoresist or polyimides such as PROBIMIDE 400 series manufactured by CIBA-GEIGY Corporation. This sub-layer can also be applied by spin or spray coating on the surface. The sacrificial sub-layer is then softbaked.

Figure 5:
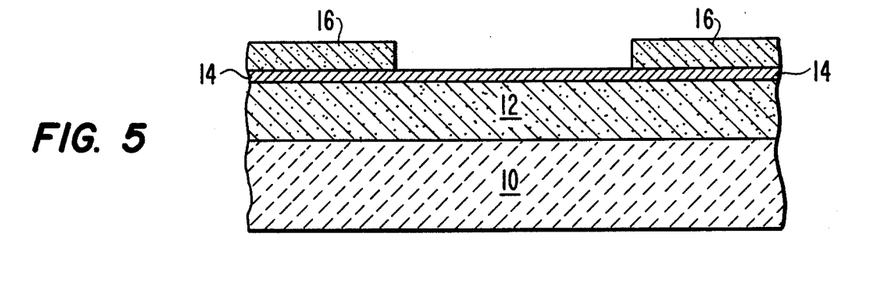
Figure 16:
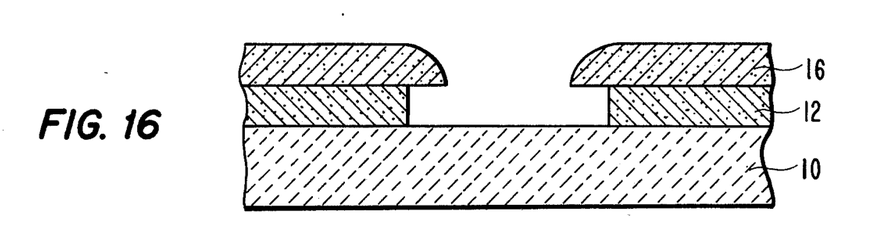

The next step of the process involves removing a portion of the sacrificial sub-layer 16 to expose a portion of the underlying sub-layer, which in FIG. 5 is metallic sub-layer 14 and in FIG. 16 is the dielectric sub-layer 12. The sacrificial layer is removed according to the desired conductor configuration. As will be evident from the following disclosure, any planar configuration can be made according to the claimed invention, resulting in conductors on different layers crossing one another at various angles.

Figure 4:
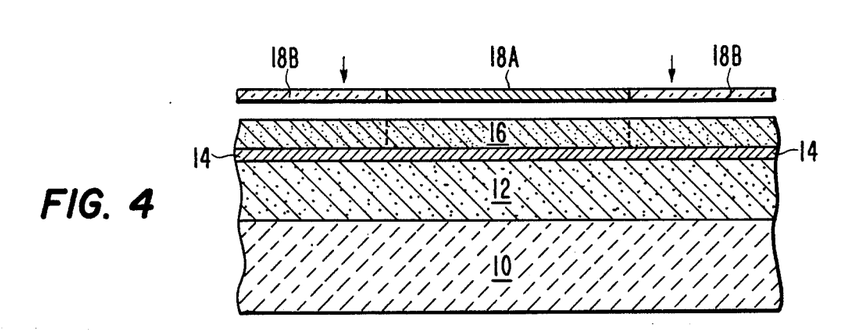

Although any conventional method can be used to remove the sacrificial layers, since the preferred materials are photosensitive, removal of the layers in the preferred embodiment, as shown in FIG. 4, is accomplished by exposing the sub-layer 16 to ultraviolet light using a mask consisting of opaque and transparent regions 18A and 18B.

Photosensitive polyimides and photoresists can be negative or positive acting and either can be used within the scope of this invention. The commonly available photosensitive polyimides are negative acting while photoresists are either positive or negative acting. In the event a negative acting material is used, 18A is opaque and after exposing the sub-layer to ultraviolet light through the mask, the portion of the sublayer underneath region 18A is removed from sub-layer 16 using conventional techniques, such as contacting with a developer.

Figure 6:
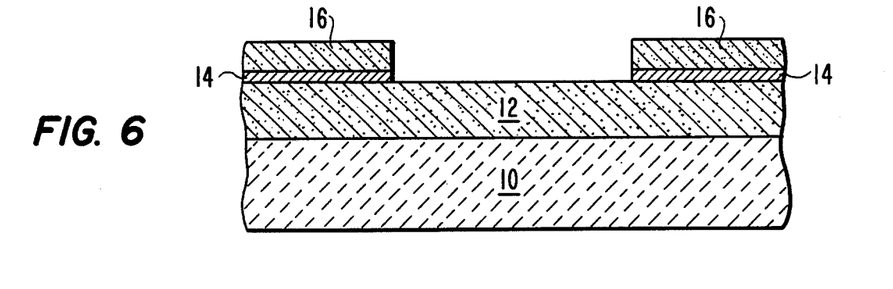

The next step of the process comprises removing, if present, the exposed portion of the metallic sub-layer 14 to expose a portion of the dielectric sub-layer 12. This is shown in FIG. 6. This portion of the metallic sub-layer can be removed using any conventional method, such as etching away the metallic sub-layer using a dilute hydrofluoric (HF) acid.

Figure 7:
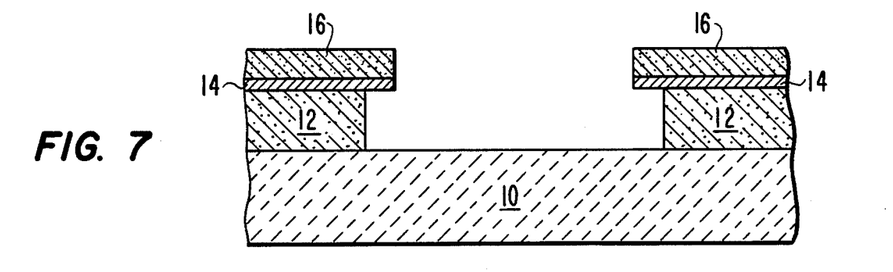

Removal of a portion of the metallic sub-layer 14 exposes a portion of the dielectric sub-layer 12. The next process step comprises removing the exposed portion of the dielectric sub-layer and a selected portion surrounding the exposed portion of the dielectric sub-layer to expose a portion of the base layer. The removal of the selected portion leaves an exposed portion of the metallic sub-layer, if present, and the sacrificial sub-layer overhanging the exposed portion of the base layer. This is shown in FIG. 7 and in FIG. 16.

If photosensitive material is used for the dielectric sub-layer 12, it is preferred that sub-layer 12 be negative acting. In that case, since it is not exposed to the ultraviolet light because of the metallic sub-layer 14, a suitable developer will remove the exposed portion of sub-layer 12.

If photosensitive material is not used for the dielectric sub-layer, such as when the dielectric material is silicon dioxide, this material can be etched using a suitable solution, such as a hydrogen fluoride based acid.

It is important in this step that the method used to remove sub-layer 12 does not remove any of sub-layer 16. This can be achieved either by selecting a removal method that will not remove the sacrificial sub-layer or by treating the sacrificial sub-layer 16 so that the method being used does not remove this sub-layer. In one preferred embodiment, the sacrificial sub-layer is exposed to ultraviolet light so that the photosensitivity of the sacrificial sub-layer prevents its removal. In another preferred embodiment, the dielectric sub-layer is removed by a solution that will not remove the sacrificial sub-layer, such as when the solution is a hydrogen fluoride based acid and the sacrificial layer is photoresist.

Removing a portion of sub-layer 12 exposes base layer 10, as well as selected portions of sub-layer 12 surrounding the exposed portion. According to the present invention, part of these selected portions are removed. In the preferred embodiment, this is accomplished by using the same method used to remove the exposed portion of the dielectric sub-layer. Preferably, the side portions are removed so as to provide an exposed overhanging portion having a lateral depth ranging from 3 micrometers to 7 micrometers per side, as shown in FIG. 7 and 16.

Curing of the layer is done at various times depending upon the materials used in the sub-layers. When the dielectric sub-layer is a polyimide, the polyimide is cured after the above removal steps. The preferred polyimide materials used in the present invention for sub-layers 12 and 16 are cured at temperature ranging from about 275° C. to about 320° C.

When the dielectric sub-layer is silicon dioxide, curing of the layer is done prior to etching the silicon dioxide layer, since the conventional etchant for silicon dioxide would attack the uncured sacrificial sub-layer.

Figure 8:
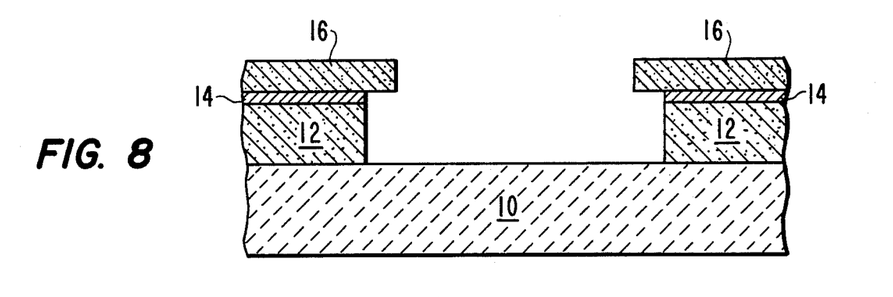

The next step in the process comprises removing the portion of the metallic sub-layer overhanging the exposed portion of the base layer, if present, as shown in FIG. 8. The overhang of the metallic sub-layer 14 can be removed in any conventional manner. In the preferred embodiment, the metallic sub-layer is etched in a dilute HF acid to expose the lower surface of the sacrificial sub-layer.

Figure 9:
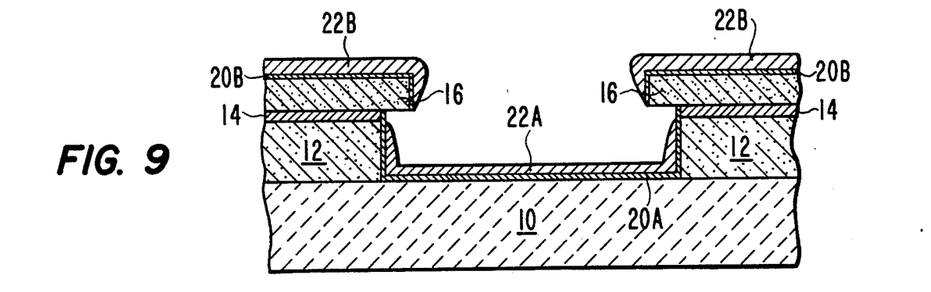
Figure 17:
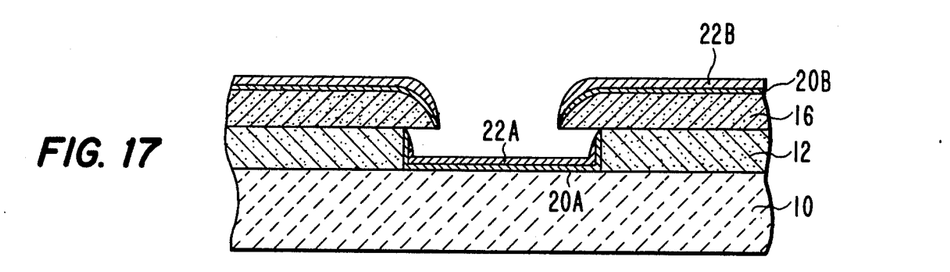

After removing a portion of the metallic sub-layer, a first conductive adhesive sub-layer 20A and 20B is deposited so as to overlay the sacrificial and dielectric sub-layers and the exposed area of the base layer without overlaying the exposed overhang portion of the sacrificial sub-layer facing the base layer. This is shown in FIG. 9 and 17. The first conductive adhesive material aids in the adhesion between the conductor and the base or dielectric sub-layer. In the preferred embodiment, chromium (Cr) is used as the first conductive adhesive material.

After forming the first conductive adhesive material, a conductive seeding sub-layer 22A and 22B is deposited to overlay the exposed surface of the first conductive adhesive material, also shown by FIG. 9 and 17. Any conductive material can be used. Preferably copper (Cu) is used.

The first conductive adhesive material and conductive seeding sub-layer are preferably deposited by cold sputtering deposition. Cold sputtering insures that the exposed overhang portion of the sacrificial sub-layer facing the substrate remains uncovered and that there is a discontinuity in the first conductive adhesive and conductive seeding sub-layers at the overhangs. It also insures that the sidewalls of the selected portions of the dielectric sub-layer are covered with the first conductive adhesive and conductive seeding sub-layers, as shown in FIG. 9 and 17. Cold sputtering deposition is preferably performed in-situ using a temperature less than 100 degrees Celsius.

Figure 10:
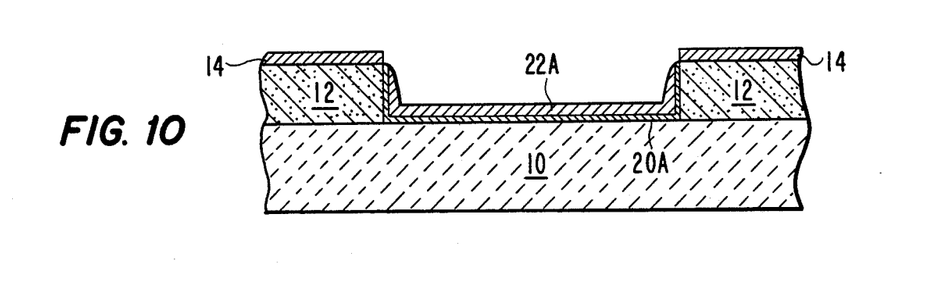
Figure 18:
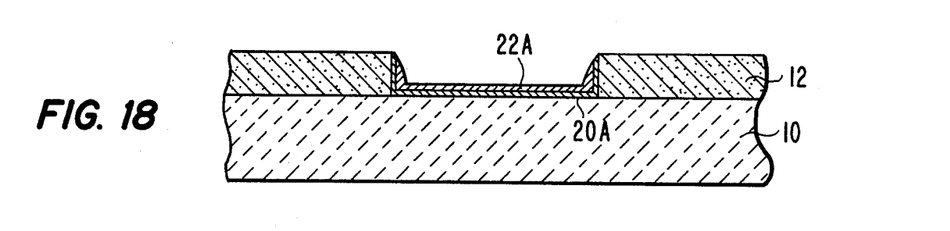

After the formation of the conductive seeding sub-layer, the sacrificial sub-layer is removed, as shown in FIG. 10 and 18. Removing this sub-layer also thereby removes the first conductive adhesive sub-layer and the conductive seeding sub-layer in contact with the sacrificial sub-layer.

In the preferred embodiment of the invention, the sacrificial sub-layer is a soluble polyimide or photoresist, which remains soluble after curing. As disclosed earlier, this type of sacrificial material is well known in the art. Since the sacrificial sub-layer 16 is soluble, the sandwich structure of the first conductive adhesive sub-layer 20B and the conductive seeding sub-layer 22B that is formed over the upper surface of the sacrificial sub-layer 16 is lifted off by immersing the sample in an ultrasonic agitated solution of solvent, such as methylene chloride or chloroform for polyimide and acetone for positive photoresist, resulting in the layer as shown in FIG. 10 and 18. The solvent should not attack the conductive adhesive or the conductive seeding sub-layers.

The contact of the solution with the soluble sacrificial sub-layer 16, as in the preferred embodiment, is facilitated by the presents of overhangs. The solution enters the overhangs where the bottom surface of the soluble sacrificial sub-layer 16 is exposed and the ultrasonic agitation enhances the liftoff action and results in the removal of the first conductive adhesive sub-layer 20B as well as the conductive seeding sub-layer 22B, as shown in FIG. 10 and 18. The first conductive adhesive sub-layer 20A and conductive seeding sub-layer 22A which are in contact with the upper surface of the base layer 10 and the side portions of the dielectric sub-layer 12 remain.

Figure 11:
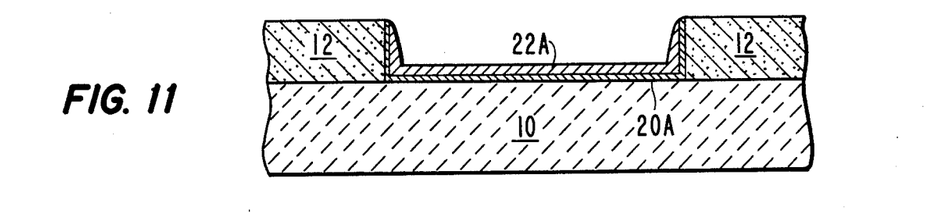

The metallic sub-layer 14, if present, can then be removed by an etchant which etches the material used in the metallic sub-layer preferentially to the conductive seeding sub-layer material, as shown in FIG. 11. Again, where the metallic sub-layer is titanium, a dilute hydrofluoric acid can be used.

Final curing, if necessary, of the dielectric sub-layer 12 can be performed at this point. The material used in one preferred embodiment, a photosensitive polyimide, is cured in a vacuum at a temperature of about 400 degrees Celsius for 1–2 hours. A vacuum cure is preferred so as to retard the oxidation of the conductive seeding sub-layer 22A. This will not affect the pattern resolution.

Figure 12:
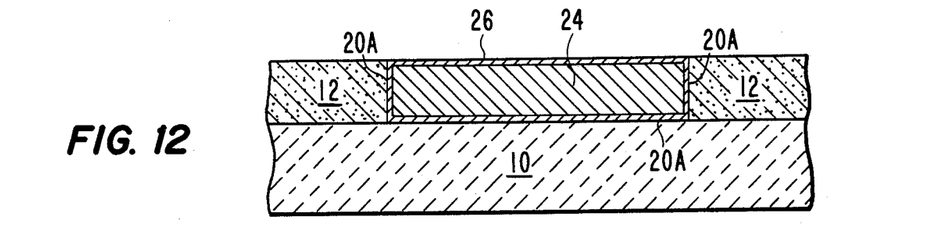
Figure 19:
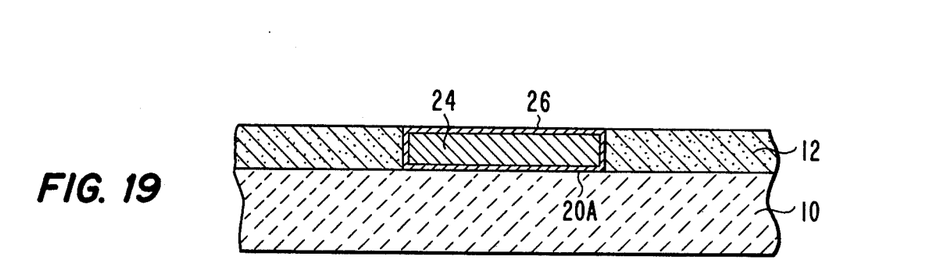

A conductor sub-layer 24 is then formed by electrolessly plating the conductor material onto the conductive seeding sub-layer 22A, as shown in FIG. 12 and 19. Electroless plating involves immersing the layer into a bath of conductor material and is a well known process in the printed wire board art. While any conductor material can be used, the preferred conductor material is copper.

A second conductive adhesive sub-layer 26 can then be electrolessly plated onto the conductor sub-layer 24, completing a single layer of the multilayer interconnection system, as shown in FIG. 12 and 19. In the preferred embodiment of the invention, the second conductive adhesive sub-layer is nickel (Ni).

This completes a single layer of the interconnection system, which comprises a completely sealed conductor sub-layer which is recessed in a cured dielectric sub-layer 12. The surface of the conductor sub-layer coincides substantially with that of the dielectric sub-layer.

It will be apparent that the invention is not restricted to the description above. For instance, the second dielectric sub-layer 16 can be a nonphotosensitive soluble material such as PROBIMIDE 200 series manufactured by CIBA-GEIGY Corporation. In this case, a negative photoresist and oxygen plasma can be used to define the pattern. The metallic sub-layer 14 and conductor materials can be other metallic materials depending upon the applications.

Figure 13:
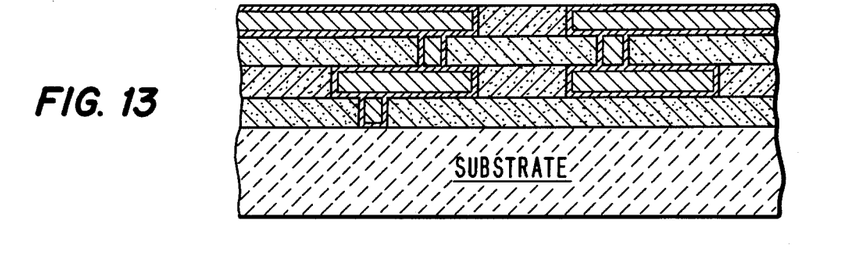
FIG. 13–14 are cross-sectional views showing several complete layers of the multilayer interconnection system.
Figure 14:
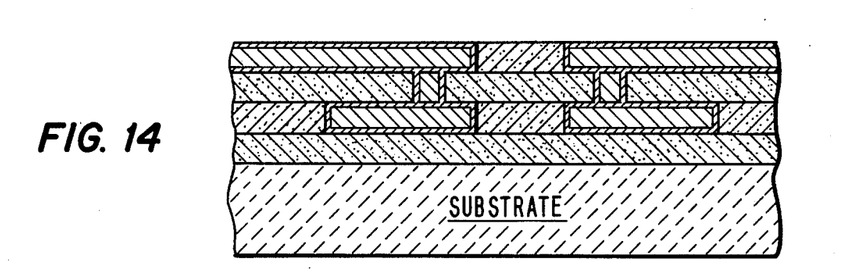

By applying a new sub-layer of dielectric material and repeating the procedures described in FIG. 1 through FIG. 12, or FIG. 15 through FIG. 19, a planar multilayer interconnection system consisting of completely sealed and corrosion resistant copper power planes and signal lines electrically separated by dielectric layers and interconnected by solid vias can be realized. The layers containing vias are formed using the same method as above, except that smaller conductor sub-layers are formed. An array of pretested high performance IC chips can then be directly attached on and interconnected by this multilayer system. FIG. 13 shows a cross-sectional view of two conductor sub-layers interconnected to each other and connected to the substrate through solid vias. FIG. 14 shows a cross-sectional view of two conductor sub-layers interconnected by solid vias but isolated from the substrate.

What is claimed:

1. A method for fabricating a layer of a planar multilayer interconnection system comprising:
    (a) forming a dielectric sub-layer overlaying a base layer, said dielectric sub-layer being nonsoluble after said layer is cured;
    (b) forming a sacrificial sub-layer overlaying said dielectric sub-layer, said sacrificial sub-layer being soluble after said layer is cured;
    (c) removing a portion of said sacrificial sub-layer to expose a portion of said dielectric sub-layer;
    (d) removing said exposed portion of said dielectric sub-layer and a selected portion surrounding said exposed portion of said dielectric sub-layer to expose a portion of said base layer, removal of said selected portion leaving an exposed portion of said sacrificial sub-layer overhanging said exposed portion of said base layer;
    (e) depositing a first conductive adhesive sub-layer overlaying said dielectric and sacrificial sub-layers and said exposed area of said base layer without overlaying said exposed overhanging portion facing the base layer of said sacrificial sub-layer;
    (f) depositing a conductive seeding sub-layer overlaying said first conductive adhesive sub-layer;
    (g) removing said sacrificial sub-layer and said first conductive adhesive sub-layer and said conductive seeding sub-layer in contact with said sacrificial sub-layer;
    (h) forming a conductor sub-layer by electrolessly plating a conductor sub-layer onto said seeding sub-layer; and
    (i) forming a second conductive adhesive sub-layer by electrolessly plating said second adhesive sub-layer onto said conductor sub-layer to form a surface which is planar with said dielectric sub-layer.

2. The method according to claim 1 where said sacrificial sub-layer is selected from the group consisting of photosensitive soluble polyimide and photoresist.

3. The method according to claim 2 where in step (c), said sacrificial sub-layer is removed by masking a portion of said sacrificial sub-layer and exposing said layer to ultraviolet light.

4. The method according to claim 1 where in step (d), said selected portions are removed so as to provide an overhang of about 3 to about 7 micrometers in lateral depth.

5. The method according to claim 1 where said first conductive adhesive sub-layer is chromium.

6. The method according to claim 1 where said conductive seeding sub-layer is copper.

7. The method according to claim 1 where said first conductive adhesive sub-layer and said conductive seeding sub-layer are applied by cold sputtering deposition.

8. The method according to claim 1 where said conductor sub-layer is copper.

9. The method according to claim 1 where said second conductive adhesive sub-layer is nickel.

10. The method according to claim 1 where each layer of a multilayer interconnection system is fabricated using steps (a) through (i).

11. A method for fabricating a layer of a planar multilayer interconnection system comprising:
 (a) forming a polyimide sub-layer overlaying a base layer, said polyimide sub-layer being nonsoluble after said layer is cured;
 (b) forming a metallic sub-layer overlaying said polyimide sub-layer;
 (c) forming a sacrificial sub-layer overlaying said metallic sub-layer, said sacrificial sub-layer being selected from polyimides which are soluble after said layer is cured;
 (d) removing a portion of said sacrificial sub-layer to expose a portion of said metallic sub-layer;
 (e) removing said exposed portion of said metallic sub-layer to expose a portion of said polyimide sub-layer;
 (f) removing said exposed portion of said polyimide sub-layer and a selected portion surrounding said exposed portion of said polyimide sub-layer to expose a portion of said base layer, removal of said selected portion leaving an exposed portion of said metallic sub-layer and said sacrificial sub-layer overhanging said exposed portion of said base layer;
 (g) removing said portion of said metallic sub-layer overhanging said exposed portion of said base layer;
 (h) depositing a first conductive adhesive sub-layer overlaying said polyimide and sacrificial sub-layers and said exposed area of said base layer without overlaying said exposed overhang portion facing said base layer of said sacrificial sub-layer;
 (i) depositing a conductive seeding sub-layer overlaying said first conductive adhesive sub-layer;
 (j) removing said sacrificial sub-layer and said first conductive adhesive sub-layer and said conductive seeding sub-layer in contact with said sacrificial sub-layer;
 (k) removing said metallic sub-layer;
 (l) forming a conductor sub-layer by electrolessly plating a conductor sub-layer onto said conductive seeding sub-layer; and
 (m) forming a second conductive adhesive sub-layer by electrolessly plating said second adhesive sub-layer onto said conductor sub-layer to form a surface which is planar with said polyimide sub-layer.

12. The method according to claim 11 where said polyimide sub-layer is a photosensitive nonsoluble polyimide.

13. The method according to claim 11 where said metallic sub-layer is titanium.

14. A method for fabricating a layer of a planar multilayer interconnection system comprising:
 (a) forming a silicon dioxide sub-layer overlaying a base layer;
 (b) forming a sacrificial sub-layer overlaying said silicon dioxide sub-layer, said sacrificial sub-layer being soluble after said layer is cured;
 (c) removing a portion of said sacrificial sub-layer to expose a portion of said silicon dioxide sub-layer;
 (d) removing said exposed portion of said silicon dioxide sub-layer and a selected portion surrounding said exposed portion of said silicon dioxide sub-layer to expose a portion of said base layer, removal of said selected portion leaving an exposed portion of said sacrificial sub-layer overhanging said exposed portion of said base layer;
 (e) depositing a first conductive adhesive sub-layer overlaying said silicon dioxide and sacrificial sub-layers and said exposed area of said base layer without overlaying said exposed overhang portion facing said base layer of said sacrificial sub-layer;
 (f) depositing a conductive seeding sub-layer overlaying said first conductive adhesive sub-layer;
 (g) removing said sacrificial sub-layer and said first conductive adhesive sub-layer and said conductive seeding sub-layer in contact with said sacrificial sub-layer;
 (h) forming a conductor sub-layer by electrolessly plating a conductor sub-layer onto said seeding sub-layer; and
 (i) forming a second conductive adhesive sub-layer by electrolessly plating said second adhesive sub-layer onto said conductor sub-layer to form a surface which is planar with said silicon dioxide sub-layer.

* * * * *